(12) United States Patent
Roy et al.

(10) Patent No.: US 12,498,634 B2
(45) Date of Patent: Dec. 16, 2025

(54) SYSTEM AND METHOD FOR GENERATING CONTROL VALUES FOR OVERLAY CONTROL OF AN IMPRINT TOOL

(71) Applicant: CANON KABUSHIKI KAISHA, Tokyo (JP)

(72) Inventors: Nilabh K. Roy, Austin, TX (US); Mario Johannes Meissl, Austin, TX (US); Anshuman Cherala, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 702 days.

(21) Appl. No.: 17/816,078

(22) Filed: Jul. 29, 2022

(65) Prior Publication Data

US 2024/0036464 A1 Feb. 1, 2024

(51) Int. Cl.
G03F 7/00 (2006.01)

(52) U.S. Cl.
CPC ........ *G03F 7/0002* (2013.01); *G03F 7/70491* (2013.01); *G03F 7/70633* (2013.01)

(58) Field of Classification Search
CPC . G03F 7/0002; G03F 7/70491; G03F 7/70633
See application file for complete search history.

(56) References Cited

U.S. PATENT DOCUMENTS

| | | | |
|---|---|---|---|
| 7,727,453 B2 * | 6/2010 | Sreenivasan | G03F 7/0002 264/494 |
| 7,768,624 B2 | 8/2010 | Cherala | |
| 9,993,962 B2 | 6/2018 | Cherala | |
| 10,191,368 B2 * | 1/2019 | Sreenivasan | G03F 9/7042 |
| 10,553,501 B2 | 2/2020 | Cherala | |
| 10,761,316 B2 | 9/2020 | Miyaharu | |
| 11,347,144 B2 | 5/2022 | Cherala | |
| 2010/0270705 A1 * | 10/2010 | Okushima | B82Y 40/00 264/293 |
| 2014/0065735 A1 * | 3/2014 | Koshiba | G03F 7/0002 427/8 |
| 2020/0363715 A1 | 11/2020 | Hayashi | |
| 2020/0379343 A1 | 12/2020 | Kusaka | |

OTHER PUBLICATIONS

Anshuman Cherala et al., Addressing Nanoimprint Lithography Mix & Match Overlay Using Drop Pattern Compensation, Proc. of SPIE vol. 11324, Apr. 21, 2020.

* cited by examiner

*Primary Examiner* — Nghia M Doan
(74) *Attorney, Agent, or Firm* — Canon U.S.A., Inc. IP Division

(57) ABSTRACT

Some devices, systems, and methods obtain a set of relationship values, wherein the set of relationship values indicates relationships between control values for an imprint apparatus and corresponding overlay corrections; and estimate a set of control values based on a constrained optimization that uses the set of relationship values such that the set of control values globally minimizes a residual overlay error while the set of control values is maintained within a set of operating constraints, wherein the set of control values includes a set of in-plane control values that are in a plane and a set of out-of-plane control values that are out of the plane, wherein the plane is parallel to a template-substrate interface.

17 Claims, 8 Drawing Sheets

SYSTEM AND METHOD FOR GENERATING CONTROL VALUES FOR OVERLAY CONTROL OF AN IMPRINT TOOL

BACKGROUND

Technical Field: This application generally concerns an imprint system and a method that corrects the overlay of the imprinted substrate.

Background: Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, optical components, and the like.

Some nanoimprint lithography techniques form a feature pattern in a formable material (polymerizable) layer and transfer a pattern corresponding to the feature pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) involves dispensing a variable drop pattern of polymerizable material between the substrate and a superstrate, where the drop pattern varies depending on the substrate's relief pattern. A superstrate is then brought into contact with the polymerizable material, after which the material is polymerized on the substrate, and the superstrate removed.

Various lithographic patterning techniques benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL), planarization improves feature filling and CD control after pattern transfer.

And a substrate with polymerized material can be further subjected to known procedures and processes for device (article) fabrication, including, for example, curing, oxidation, layer formation, deposition, doping, planarization, etching, formable material removal, dicing, bonding, packaging, and the like.

When forming nanoscale patterns on semiconductor wafers in the fabrication of semiconductor devices, proper registration or alignment of one pattern layer to a second pattern layer, also referred to as overlay, is important for the final electronic device to function correctly.

SUMMARY

Some embodiments of a method of generating a set of control values for an imprint apparatus comprise obtaining a set of relationship values, wherein the set of relationship values indicates relationships between control values for an imprint apparatus and corresponding overlay corrections; and estimating a set of control values based on a constrained optimization that uses the set of relationship values such that the set of control values globally minimizes a residual overlay error while the set of control values is maintained within a set of operating constraints, wherein the set of control values includes a set of in-plane control values that are in a plane and a set of out-of-plane control values that are out of the plane, wherein the plane is parallel to a template-substrate interface.

Some embodiments of a system comprise one or more computer-readable media and one or more processors. The one or more processors cooperate with the one or more computer-readable media to obtain a set of relationship values, wherein the set of relationship values indicates relationships between control values for an imprint apparatus and corresponding overlay corrections; and calculate a set of control values based on a constrained optimization that uses the set of relationship values such that the set of control values globally minimizes a residual overlay error while the set of control values is maintained within a set of operating constraints, wherein the set of control values includes a set of in-plane control values that are in a plane and a set of out-of-plane control values that are out of the plane, wherein the plane is parallel to a template-substrate interface.

Some embodiments of one or more computer-readable storage media store instructions that, when executed by one or more computing devices, cause the one or more computing devices to perform operations that comprise obtaining a set of relationship values, wherein the set of relationship values indicates relationships between control values for an imprint apparatus and overlay corrections on a substrate imprinted by a template of the imprint apparatus; and calculating a set of control values that remains within a set of operating constraints while a residual overlay error is globally minimized, wherein calculating the set of control values includes performing a constrained optimization based on the set of relationship values, wherein the set of control values includes a set of actuator control values that control a plurality of actuators configured to compress the template and a set of heater control values that control a heat source configured to heat the substrate, and wherein the set of control values further includes a set of stage-control values which control a substrate stage configured to move the substrate relative to the template and the heat source or a set of drop-pattern-control values that control a fluid dispenser that is configured to deposit drops of formable material on the substrate such that the drops of formable material correct uneven areas on the surface of the substrate.

DESCRIPTION

Figure 1:
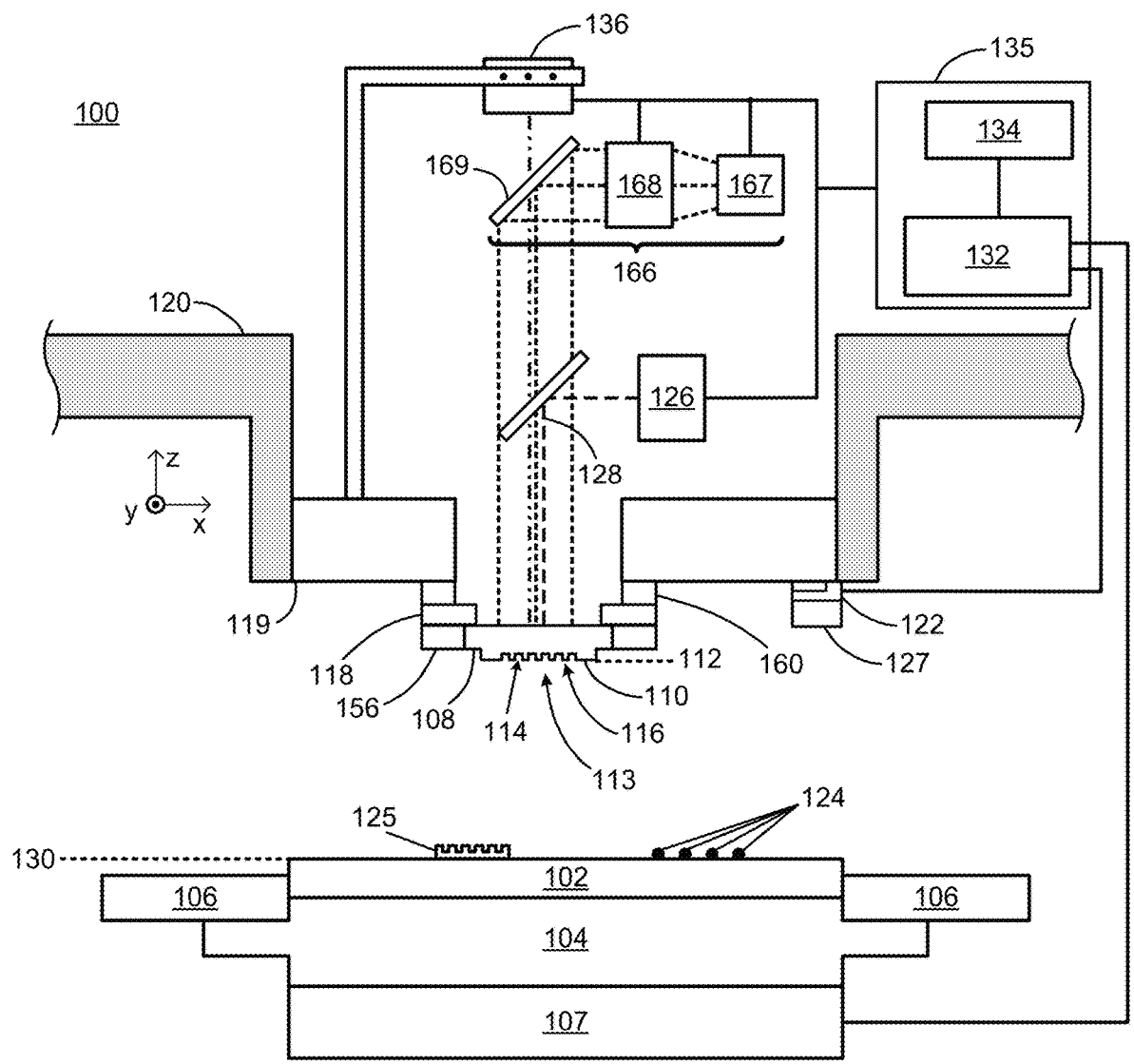
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or." And, as used herein, the terms "first," "second," and so on, do not necessarily denote any ordinal, sequential, or priority relation and may be used to more clearly distinguish one member, operation, element, group, collection, set, etc. from another without expressing any ordinal, sequential, or priority relation.

Furthermore, in this description and the drawings, an alphabetic suffix on a reference number may be used to indicate a specific instance of the feature identified by the reference numeral. For example, the imprint fields in a group of imprint fields may be identified with the reference numeral 141 when a particular imprint field is not being distinguished. However, 141A may be used to identify a specific imprint field when the specific imprint field is being distinguished from the rest of the imprint fields 141.

FIG. 1 illustrates an example embodiment of an imprint system 100 (e.g., a nanoimprint lithography system). Also, in some embodiments, the imprint system 100 is implemented as a single imprint device. When operating, the imprint system 100 deposits drops of formable material 124 (e.g., resist) on a substrate 102 (e.g., a wafer) and forms a patterned layer 125, which has a relief pattern, in the formable material in an imprint field on the substrate 102 by using a template 108 to imprint the formable material on the substrate 102. The template 108 includes a mold 110 (e.g., a mesa) that has pattern area 113 that includes a pattern surface 112. And a single mold 110 may be used to imprint formable material in a plurality of imprint fields on a single substrate 102 or a plurality of substrates 102. In some embodiments, the substrate 102 is in the form of a wafer.

Distortions within the imprint system 100 may cause overlay errors (e.g., residual overlay errors) in imprinted substrates 102 (e.g., substrates 102 on which a patterned layer 125 has been formed). The imprint system 100 may compensate for distortions within the imprint system 100 in order to reduce (or eliminate) overlay errors. Distortions include in-plane alignment errors, out-of-plane alignment errors, and out-of-plane deformations. Distortions may come from the following (as well as any combination of the following): a substrate 102; a template 108; other components of the imprint system 100; a pattern distortion of the mold 110; a distortion on the substrate 102 due to a placement error; and a deformation (e.g., deviation in planarity) of a substrate support surface of a chucking region of a substrate chuck 104, of a support surface of a template chuck 118, of a primary or chucked surface of a substrate 102, or of a primary or chucked surface of a mold 110 of a template 108.

Also, in-plane alignment errors may be caused by placement errors, rotation errors, magnification errors, skew errors, template-distortion errors, or any combination thereof. Placement errors generally refers to X-Y positioning errors between a template 108 and substrate 102 (that is, translation along the X axis, the Y axis, or both, where the X and Y axes are in the plane of or parallel to the pattern surface 112 of the template 108 or the substrate 102, as depicted in FIG. 1). Rotation (or theta) error generally refers to the relative orientation error about the Z axis (that is, rotation about the Z axis, where the Z axis is orthogonal to the X-Y plane as depicted in FIG. 1). Magnification errors generally refer to thermal, optical, or material induced shrinkage or expansion of the imprinted area as compared to the original patterned area on the template 108. Skew errors generally refer to a skewing of the template 108 with respect to the substrate 102, such that sides of the template 108 are not orthogonal. Template-distortion errors generally include magnification of a first portion of a template 108 relative to a second portion of the template 108, such that the template 108 has a trapezoidal or higher-order polygonal distortion with respect to the substrate 102.

Out-of-plane alignment errors may be caused by force errors and "tilt" errors that are manifested as a result of bending of the template 108. Generally, an imprint force is the force exerted by the template 108 against the formable material 124. The final imprint force is the force exerted by the template 108 against the formable material 124 during (e.g., at the end of) the curing of the formable material 124. And, for example, when the force is too low on a corner of the template 108, the template 108 bends such that the distance between the surface of the template 108 and the surface of the substrate 102 at the corner is greater than the distance at a central region of the template 108. When the force is too high on a corner of the template 108, the template 108 bends such that the distance between the surface of the template 108 and the surface of the substrate 102 at the corner is less than the distance at a central region of the template 108. These out-of-plane deformations give rise to in-plane deformations of the template, causing overlay errors. For example, for a 0.5, 0.8 1.0, 1.1, 1.2, or 1.3 mm thick fused silica template with 20, 50, 64, 100, or 120 mm diameter core out, a 1 N final imprint force typically causes alignment marks in a peripheral region (e.g., a corners) of the template 108 to deform by about 2-30 nm of in-plane deformations. Increasing or decreasing the force exerted on the substrate 102 by the template 108 may be accomplished by decreasing or increasing a distance between the substrate 102 and the template 108, respectively, through movement of the template 108 via the imprint head along the Z axis.

Tilt errors include rotations of the template 108 about an axis in the X-Y plane of the template 108, relative to the substrate 102. Such rotations may cause a bending of the template 108 in a peripheral region (e.g., a corner). When the template 108 is rotated (or "tilted") about an axis in the X-Y plane of the template 108, the template 108 may bend at some of its corners. Also, the distance between a corner and the substrate 102 is less than the distance between the template 108 and the substrate 102 at a central region of the template 108, and the distance between another corner and the substrate 102 is greater than the distance between the template 108 and the substrate 102 at the central region.

Out-of-plane deformations, in particular out-of-plane deformations caused by force errors at corners of a template 108, when detected and analyzed by a "through the mask" (TTM) alignment system based on alignment marks in corners of the template 108, register as an apparent field magnification (e.g., in-plane deformation). In addition to degrading overlay, this deformation may also preclude the use of certain alignment marks for real-time adjustment, because apparent magnification due to force on the substrate 102 by the template 108 in the Z direction can be difficult to distinguish from in-plane magnification. In addition to the imprint force (e.g., final imprint force), field tilt in the X and Y directions can also affect overlay.

The overlay errors may include first-order error components (linear error components), such as a magnification component and a rhombic component, each of which can be approximated by a linear function; and may include second- or higher-order error components (high-order error components), each of which can be approximated by a second- or higher-order function.

The imprint system 100 may use various techniques, alone or in any combination, to compensate for distortions and to compensate for (reduce, eliminate) overlay errors. For example, the imprint system 100 may compensate for placement errors in which a template-alignment mark and a corresponding substrate-alignment mark are offset in the X-Y plane by relative movement of the template 108 and the substrate 102 (e.g., by controlled movement of the substrate 102, the template 108, or both in the X-Y plane). The imprint system 100 may compensate for rotation errors by altering the relative angle of the template 108 and substrate 102 in the X-Y plane (e.g., by rotation of the substrate 102, the template 108, or both). The imprint system 100 may compensate for magnification errors and template-distortion errors by altering the physical dimensions of the template 108 in the X-Y plane (e.g., by increasing or decreasing a compression force to opposite sides of the template 108) or by altering the physical dimensions of the substrate 102 in the X-Y plane (e.g., by heating portions of the substrate 102). The imprint system 100 may compensate for tilt errors by adjusting a tilt (about an axis in the X-Y plane) of the template 108 relative to the substrate 102.

Furthermore, the imprint system 100 may perform drop pattern compensation (DPC). DPC produces a drop pattern that compensates for (e.g., corrects) overlay errors and distortions, for example a distortion in the substrate 102, a distortion in the substrate chuck 104, a distortion in the mold 110, a distortion in the template chuck 118, or any combination thereof. For example, drop patterns are sometimes designed to minimize the fill time of the formable material 124 and to create a uniform residual layer beneath the pattern of the patterned layer 125. However, there may be both (i) long wavelength flatness errors that are caused by the substrate chuck 104 and (ii) existing pattern topography from previously patterned layers, which can cause out-of-plane distortions and overlay errors. And, when the mold 110 comes in contact with the formable material 124 on the substrate 102, these out-of-plane errors can then induce mold bending, which causes distortions. The imprint system 100 may generate drop patterns that compensate for at least some of these distortions. Further details and examples of the generation of such drop patterns are disclosed in U.S. Pat. Nos. 9,993,962 and 10,553,501, the relevant disclosures of which are incorporated by reference herein.

First, this description will present an overview of the imprint system 100.

In the embodiment of the imprint system 100 in FIG. 1, the perimeter of the substrate 102 is surrounded by an applique 106. The applique 106 may be configured to stabilize the local gas environment beneath the template 108 or help protect the pattern surface 112 from particles, for example when the template is not above the substrate surface 130. Furthermore, an upper surface of the applique 106 may be below (e.g., as shown in FIG. 1) or coplanar with the substrate surface 130.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The template 108 may include a body that includes the mold 110, which extends toward the substrate 102 along the z axis. The mold 110 may have a pattern area 113 that includes a pattern surface 112 thereon. Also, the template 108 may be formed without the mold 110. Thus, in some embodiments, the surface of the template 108 that faces the substrate 102 functions as the mold 110, and the pattern surface 112 is included on the surface of the template 108 that faces the substrate 102. Examples of materials that may constitute the template 108 or the mold 110 include the following: fused-silica, quartz, silicon, organic polymers, siloxane polymers, borosilicate glass, fluorocarbon polymers, metal, and hardened sapphire.

The pattern surface 112 has features that are defined by a plurality of spaced-apart template recesses 114 or template protrusions 116, although some embodiments include other configurations (e.g., a planar surface). The pattern surface 112 defines a pattern that forms the basis (e.g., an inverse) of the relief pattern of the patterned layer 125, which is formed from the drops of formable material 124 on the substrate 102. In some embodiments, the pattern surface 112 is featureless, in which case a planar surface is formed from formable material on the substrate 102. In some embodiments (e.g., embodiments that perform Inkjet-based Adaptive Planarization (IAP)), the pattern surface 112 is featureless and is substantially the same size as the substrate 102, in which case a planar surface is formed from formable material across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a frame 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The imprint system 100 may include one or more motors that move the template 108, the template chuck 118, or the imprint head 119. For example, one or more motors may rotate the template 108 about an axis in the X-Y plane of the template 108. Rotation of template 108 about an axis in the X-Y plane (e.g., a rotation about the X axis, a rotation about the Y axis) of the template changes an angle between the X-Y plane of the template 108 and the X-Y plane of substrate 102, and may be referred herein to as "tilting" the template 108 with respect to the substrate 102, changing a "tilt" or "tilt angle" of the template 108 with respect to the substrate 102, or adjusting the "tilt" or "tilt angle" of the template 108 relative to the substrate 102.

The imprint system 100 also includes a fluid dispenser 122. The fluid dispenser 122 may include a fluid-dispense head 127 and fluid-dispense ports. The fluid-dispense ports may have a fixed configuration such that the fluid-dispense head 127 and fluid-dispense ports move as a unit and do not move independently of each other. Thus, the fluid-dispense ports may be fixed relative to one another on the fluid-dispense head 127. The number of fluid-dispense ports can vary between embodiments. For example, some embodiments have at least two fluid-dispense ports, at least three fluid-dispense ports, at least four fluid-dispense ports, at least five fluid-dispense ports, at least ten fluid-dispense ports, at least twenty fluid-dispense ports, or over a hundred fluid-dispense ports. In some embodiments, the fluid-dispense ports include a set of at least three fluid-dispense ports that lie along a line. In some embodiments, the fluid-dispense head 127 includes hundreds of fluid-dispense ports that lie along multiple parallel lines.

The fluid dispenser 122 may also be moveably coupled to the frame 120. In some embodiments, the fluid dispenser 122 and the template chuck 118 share one or more positioning components. And in some embodiments, the fluid dispenser 122 and the template chuck 118 move independently of each other. Also, in some embodiments, the fluid dispenser 122 and the template chuck 118 are located in different subsystems of the imprint system 100, and the substrate 102 is moved between the different subsystems.

When operating, the fluid-dispense ports of the fluid dispenser 122 deposit drops of liquid formable material 124 onto the substrate 102 according to a drop pattern. The formable material may be, for example, a resist (e.g., photo resist) or another polymerizable material, and the formable material may comprise a mixture that includes a monomer. The drops of formable material 124 may be dispensed upon the substrate 102 before or after a desired field volume is defined between the pattern surface 112 and the substrate 102, depending on the embodiment. The field volume indicates the volume of formable material 124 required to produce all of the desired features of the patterned layer 125 (e.g., all of the features of the patterned layer 125 in an imprint field). Different fluid dispensers 122 may use different technologies to dispense the drops of formable material 124. When the formable material 124 is jettable, ink-jet-type fluid dispensers 122 may be used to dispense the drops of formable material 124. For example, thermal ink-jetting, microelectromechanical-systems-based (MEMS-based) ink jetting, and piezoelectric ink jetting are technologies for dispensing jettable liquids.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The imprint system 100 also includes an energy source 126 that directs actinic energy along an exposure path 128. The imprint head 119 and the substrate positioning stage 107 may be configured to position the template 108 and the substrate 102 on (e.g., in superimposition with) the exposure path 128. The imprint system 100 also includes at least one imaging device 136 (e.g., camera). The imaging device 136 may be positioned such that an imaging field of the imaging device 136 includes the template 108 and such that the imaging field is in superimposition with at least part of the exposure path 128.

Once the drops of formable material 124 have been deposited on the substrate, either the imprint head 119, the substrate positioning stage 107, or both varies a distance between the mold 110 and the substrate 102 to define a desired field volume that is filled by the formable material 124. For example, the imprint head 119 may apply a force to the template 108 that moves the mold 110 into contact with the drops of formable material 124 that are on the substrate 102. After the desired field volume is filled with the formable material 124, the energy source 126 produces energy (e.g., actinic radiation (UV)) that is directed along the exposure path 128 to the formable material and that causes the formable material 124 to cure, solidify, or cross-link in conformance to a shape of the substrate surface 130 and the pattern surface 112, thereby defining a patterned layer 125 on the substrate 102. The formable material 124 is cured while the template 108 is in contact with the formable material 124, thereby forming the patterned layer 125 on the substrate 102. Thus, the imprint system 100 uses an imprinting process to form the patterned layer 125, which has recesses and protrusions that are an inverse of the pattern in the pattern surface 112.

The imprinting process may be done repeatedly in a plurality of imprint fields (e.g., the imprint fields 141 in FIG. 2) that are spread across the substrate surface 130. For example, each of the imprint fields may be the same size as the mold 110 or the same size as only the pattern area 113 of the mold 110. The pattern area 113 of the mold 110 includes the pattern surface 112 that is used to imprint patterns on a substrate 102 (e.g., a region that includes the template recesses 114 and the template protrusions 116). The pattern area 113 of the mold 110 may include fluid control features that are used to prevent extrusions. In some embodiments, the substrate 102 has only one imprint field, and the imprint field is the same size as the substrate 102 or as the area of the substrate 102 which is to be patterned with the mold 110. Also, in some embodiments, the imprint fields overlap. Some of the imprint fields may be partial imprint fields that intersect a boundary of the substrate 102.

Figure 3A:
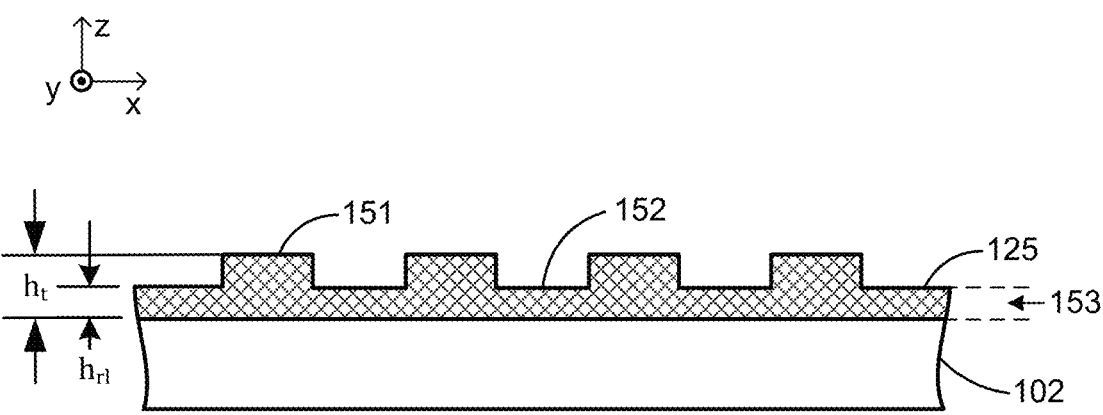
FIG. 3A illustrates an example embodiment of a residual layer.

The patterned layer 125 may be formed such that it has a residual layer that has a residual layer thickness (RLT), and the patterned layer 125 may also include one or more features, such as protrusions, that extend above the residual layer. For example, FIG. 3A illustrates an example embodiment of a residual layer. In FIG. 3A, a patterned layer 125 has been formed on a substrate 102. The patterned layer 125 includes a residual layer 153 and a plurality of features that are shown as protrusions 151 and recesses 152. The protrusions 151 have an imprint thickness $h_f$, and the residual layer 153 has a residual layer thickness (RLT) $h_{rl}$. These protrusions match the recesses 114 in the pattern surface 112 of the mold 110.

The patterned layer 125 can be further subjected to known procedures and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, optical components, and MEMS.

Figure 3B:
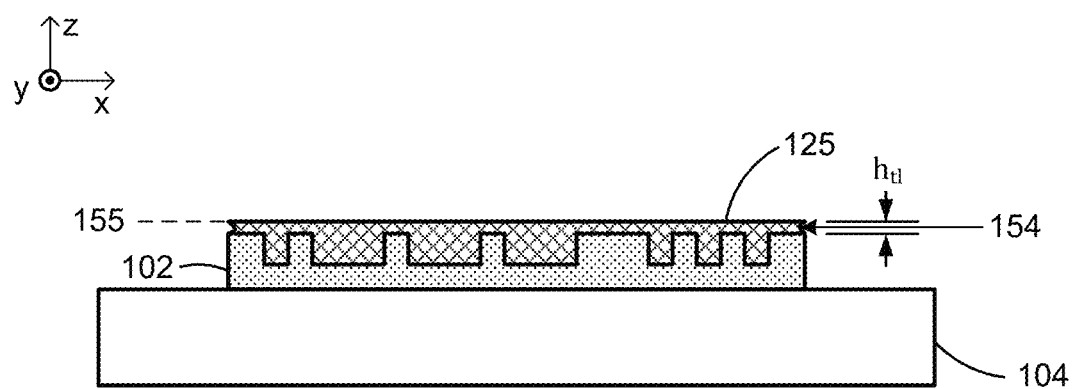
FIG. 3B illustrates an example embodiment of a top layer.

Also, in embodiments of the imprint system 100 that perform IAP, the substrate 102 may have a pattern on its surface, the drops of formable material 124 may form a patterned layer 125 that fills the pattern in the substrate 102, and the patterned layer 125 may have a top layer that extends above the substrate 102 and that has a top layer thickness (TLT). The upper surface of the top layer may be featureless and planar. For example, FIG. 3B illustrates an example embodiment of a top layer. FIG. 3B shows a patterned layer 125 that has been formed on a substrate 102, which includes recesses and protrusions. The substrate 102 is held by a substrate chuck 104. The patterned layer 125 fills in the recesses and protrusions in the substrate 102. The top layer 154, which may be referred to as the overburden, is formed above the substrate 102 and has a top layer thickness (TLT) $h_{tl}$. Also, an upper surface 155 of the top layer 154 is featureless and planar.

The imprint system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, or the imaging device 136, and may operate based on instructions in a computer-readable program stored in one or more computer-readable storage media 134. In some embodiments, including the embodiment in FIG. 1, the one or more processors 132 and the one or more computer-readable storage media 134 are included in a lithography-control device 135. The lithography-control device 135 regulates, controls, or directs the operations of the imprint system 100.

Each of the one or more processors 132 may be or may include one or more of the following: a central processing unit (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processor (DSP); a specially-configured computer; and other electronic circuitry (e.g., other integrated circuits). For example, a processor 132 may be a purpose-built controller or may be a general-purpose controller that has been specially-configured to be a nano-imprint-lithography-system controller.

Examples of computer-readable storage media 134 include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

In the embodiment in FIG. 1, the lithography-control device 135 may operate as a drop-pattern-generation device, which generates one or more drop patterns (dispense patterns), and the lithography-control device 135 may obtain the one or more drop patterns from another device (e.g., a drop-pattern-generation device) that generated the one or more drop patterns. For example, the one or more processors 132 may be in communication with a networked computer on which analysis is performed and control files, such as drop patterns, are generated. A drop pattern indicates where the fluid dispenser 122 should deposit drops of liquid formable material 124 onto the substrate 102. A drop pattern may be generated based, at least in part, on a field volume or on imprint-field features. Also, to account for imprint-field features, the drop density of the drop pattern may vary across the imprint field. And the drop pattern may have a uniform drop density over regions of the imprint field that have a uniform density (e.g., blank areas, or areas where the imprint-field features have a uniform feature density).

Figure 2:
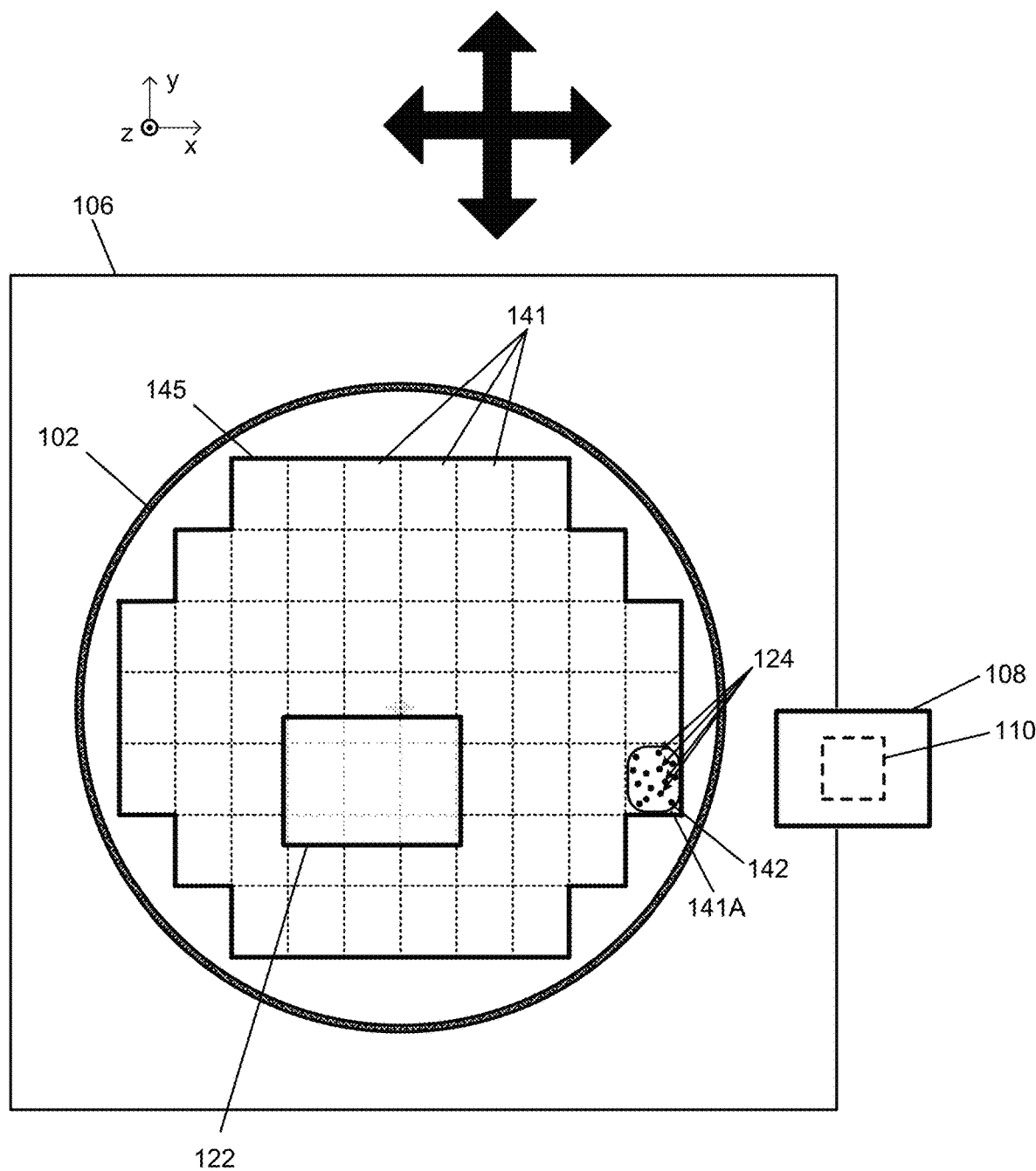
FIG. 2 illustrates a plan view (a view from along the z axis) of an example embodiment of a substrate, an applique, a fluid dispenser, a template, and a drop pattern.

FIG. 2 illustrates a plan view (a view from along the z axis) of an example embodiment of a substrate 102, an applique 106, a fluid dispenser 122, a template 108, and a drop pattern 142. The template 108 includes a mold 110. A drop-pattern-generation field 145 on the substrate 102 may include a plurality of imprint fields 141. The drop-pattern-generation field 145 is the region of the substrate 102 on which drops of formable material 124 will be deposited. In some embodiments, the drop-pattern-generation field 145 has a different shape than the shape of the drop-pattern-generation field 145 illustrated in FIG. 2, and, in some embodiments, the drop-pattern-generation field 145 includes the entire substrate 102.

On each of the imprint fields 141, a respective layer may be formed from formable material 124 (e.g., a patterned layer, a planar layer). The substrate positioning stage 107, which supports the applique 106 and the substrate 102, can move the applique 106 and the substrate 102 along both the X axis and the Y axis. This allows the substrate positioning stage 107 to position each of the imprint fields 141 under the fluid dispenser 122, which deposits drops of formable material 124 on the imprint field 141, and then under the template 108, which forms a pattern (e.g., a patterned layer) in the formable material 124 that was deposited on the imprint field 141. In some embodiments, there is only one imprint field 141 on the substrate surface.

When an imprint field 141 is positioned under the fluid dispenser 122, the fluid dispenser 122 can deposit drops of formable material 124 on the imprint field 141. For example, FIG. 2 shows an imprint field 141A on which drops of formable material 124 have been deposited by the fluid dispenser 122 according to a drop pattern 142. In some embodiments, the fluid dispenser 122 deposits the drops of formable material 124 on each of the imprint fields 141 according to the same drop pattern 142. However, in some embodiments, the fluid dispenser 122 uses different drop patterns for some of the imprint fields 141.

The imprint system 100 also includes various components and features that can be used to compensate for distortions and reduce (or eliminate) overlay errors.

First, the imprint system 100 includes one or more load sensors 160 that detect forces applied to the mold 110 (e.g., applied to specific regions of the mold 110) in the contact process or the separation process. And the imprint system 100 can control (e.g., adjust) the forces that are applied to the mold 110 (e.g., applied to specific regions of the mold 110) in the contact process or the separation process. In an alternative embodiment, the imprint system estimates the forces applied to the mold 110 based on the actuator control signals (current, voltage, etc.) of the imprint head 119 that are used to move the template chuck 118 towards the substrate chuck 104.

Figure 4:
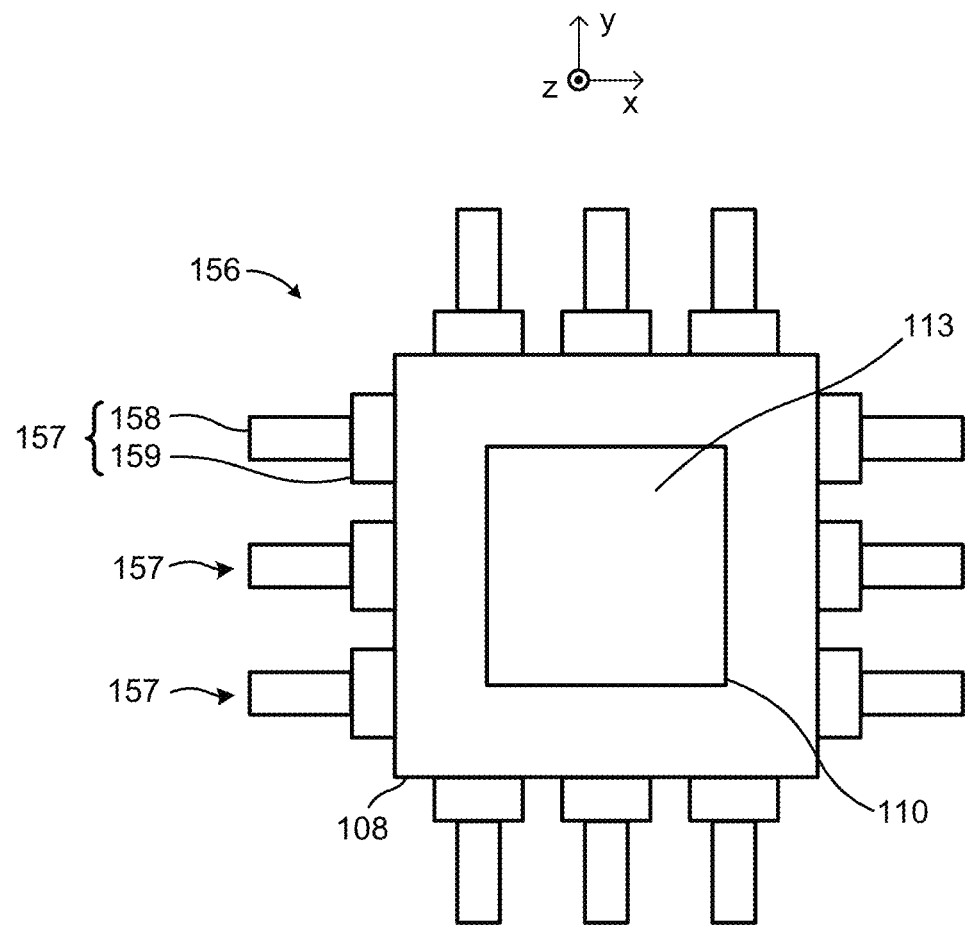
FIG. 4 illustrates an example embodiment of a deformation mechanism.

And the imprint system 100 includes a deformation device 156, which can deform the mold 110 (e.g., a pattern area 113 of the mold 110) of the template 108. The deformation device 156 may deform the mold 110 such that a shape (including a size) of the mold 110 in a plane parallel to the X-Y plane is changed. The deformation device 156 may deform the mold 110 by applying forces to at least some of the four side surfaces of the template 108 (or the mold 110), for example. An example embodiment of the deformation device 156 is illustrated in FIG. 4. The deformation device 156 in FIG. 4 includes a plurality of deformation mechanisms 157 (deformation units). For example, each side may have 3 deformation mechanisms 157, as illustrated in FIG. 4, but in some embodiments each side has more than 3 deformation mechanisms 157, such as 4, 5, or 6 deformation mechanisms 157 per side. Each deformation mechanism 157 includes a contact portion 159, which comes into contact with a side surface of the template 108, and an actuator 158, which drives the contact portion 159. The actuator 158 may include, for example, a piezo element, and may include other elements.

The deformation device 156 is a correction mechanism that physically deforms the mold 110 by applying external forces from the sides of the template 108 and the mold 110. By applying forces to the sides of the template 108, the shape of the pattern area 113 of the mold 110 can be corrected. By making the pattern area 113 a desired shape through this correction, the difference between the shape of the pattern (shot area) formed on the substrate 102 and the shape of the pattern area 113 formed in the mold 110 can be reduced.

Also, the imprint system 100 may include one or more pressure mechanisms that apply forces to a surface of the template 108 on a side opposite to the pattern surface 112 (e.g., apply forces along the direction of the negative Z axis in FIG. 1) to deform the pattern surface 112 of the mold 110 such that the pattern surface 112 of the mold 110 becomes convex toward the substrate 102 in the contact process.

The imprint system 100 also includes a substrate-heating subsystem 166 (which is an example of a substrate heating unit). The substrate-heating subsystem 166 deforms an imprint field 141 (e.g., a pattern region or a shot region) on the substrate 102 by heating the substrate 102, and the heating may be performed before any formable material has been deposited on the substrate 102 or before formable material that has been deposited on the substrate 102 is imprinted.

The substrate-heating subsystem 166 includes a heating light source 167, which irradiates the substrate 102 with light to heat the substrate 102; an adjusting unit 168, which adjusts the irradiation amount (irradiation amount distribution) of the light; and a reflecting plate 169, which defines an optical path to guide light from the adjusting unit 168 to the substrate 102. In an alternative embodiment, the substrate heating subsystem 166 is a heat source which may or may not include the heating light source 167 and is incorporated into the substrate chuck 104.

The heating light source 167 emits light that has a wavelength to which the formable material, as an ultraviolet curing resin material, is not photosensitive (not cured), for example, light in a wavelength band of 400 nm to 2,000 nm. For heating efficiency, some embodiments of the heating light source 167 emit light in a wavelength band of 500 nm to 800 nm. However, some embodiments of the heating light source 167 emit light in other wavelength bands. Also, in some embodiments, the heating light source 167 is a laser, such as a high-power laser.

The adjusting unit 168 allows only specific light of the emitted light to irradiate the substrate 102 in order to form a predetermined irradiation-amount distribution on the substrate 102. In some embodiments, the adjusting unit 168 includes one or more spatial light modulators (SLMs). An example of an SLM is a mirror array having an array of a plurality of mirrors, each including a drive axis, which may be referred to as digital mirror device (DMD), such as a digital micro-mirror device. A DMD can control (change) an irradiation amount distribution by individually adjusting the plane direction of each mirror.

Furthermore, the imaging device 136 can detect (capture images of) alignment marks and overlay marks. Substrates 102 and templates 108 may include corresponding pairs of alignment marks that allow real-time alignment of the templates 108 and the substrates 102. After a template 108 is positioned over a substrate 102 (e.g., superimposed over the substrate 102), the lithography-control device 135 determines an alignment of the template-alignment marks with respect to the substrate-alignment marks the signals (e.g., images) from the imaging device 136. Alignment schemes may include "through the mask" (TTM) measurement of alignment errors associated with pairs of corresponding alignment marks, followed by compensation of these errors to achieve accurate alignment of the template 108 and a desired imprint location on the substrate 102 as disclosed in U.S. Pat. Nos. 6,916,585; 7,170,589; 7,298,456; and 7,420,654, the relevant disclosures of which are incorporated by reference herein.

Additionally, substrates 102 and templates 108 may include corresponding pairs of overlay marks that allow for assessment of and compensation for overlay errors in imprinted substrates 102. Overlay marks in a template 108 are transferred to the polymeric layer (patterned layer 125) during polymerization of the formable material 124, yielding an imprinted substrate 102 with corresponding pairs of overlay marks. The lithography-control device 135 may assess overlay errors of corresponding pairs of overlay marks in an imprinted substrate 102 to determine in-plane and out-of-plane contributions to overlay errors.

And, as noted above, one or both of the substrate positioning stage 107 and the imprint head 119 can be moved (e.g., translated, rotated) to change the relative positions of the substrate 102 and the imprint head 108. Also, the tilt of the imprint head 108 (or, in some embodiments, the tilt of the substrate 102) can be adjusted. For example, the imprint system 100 may include actuators (or other devices) that can translate the template 108 about orthogonal axes (X and Y axes in FIG. 1) in the plane of the template 108, rotate the template 108 about an axis orthogonal to the plane (the Z axis in FIG. 1), or both. Also for example, some embodiments of the imprint system 100 may translate the template 108 along the Z axis and rotate of the template 108 about an axis in the plane of the template 108 (X and Y axes in FIG. 1).

The distortions (e.g., in-plane errors, out-of-plane errors) may be compared with overlay errors associated with known orientation parameters of a template 108 with respect to a substrate 102 (e.g., in one or more lookup tables). Corrected orientation parameters may be selected to reduce overlay errors in subsequent imprinted substrates 102. In some devices, systems, and methods, a feedforward scheme based on corresponding pairs of overlay marks in an imprinted substrate 102 is combined with a feedback or feedforward scheme based on corresponding pairs of alignment marks on a template 108 and a substrate 102 to reduce in-plane and out-of-plane overlay errors on an imprinted substrate 102.

Figure 5:
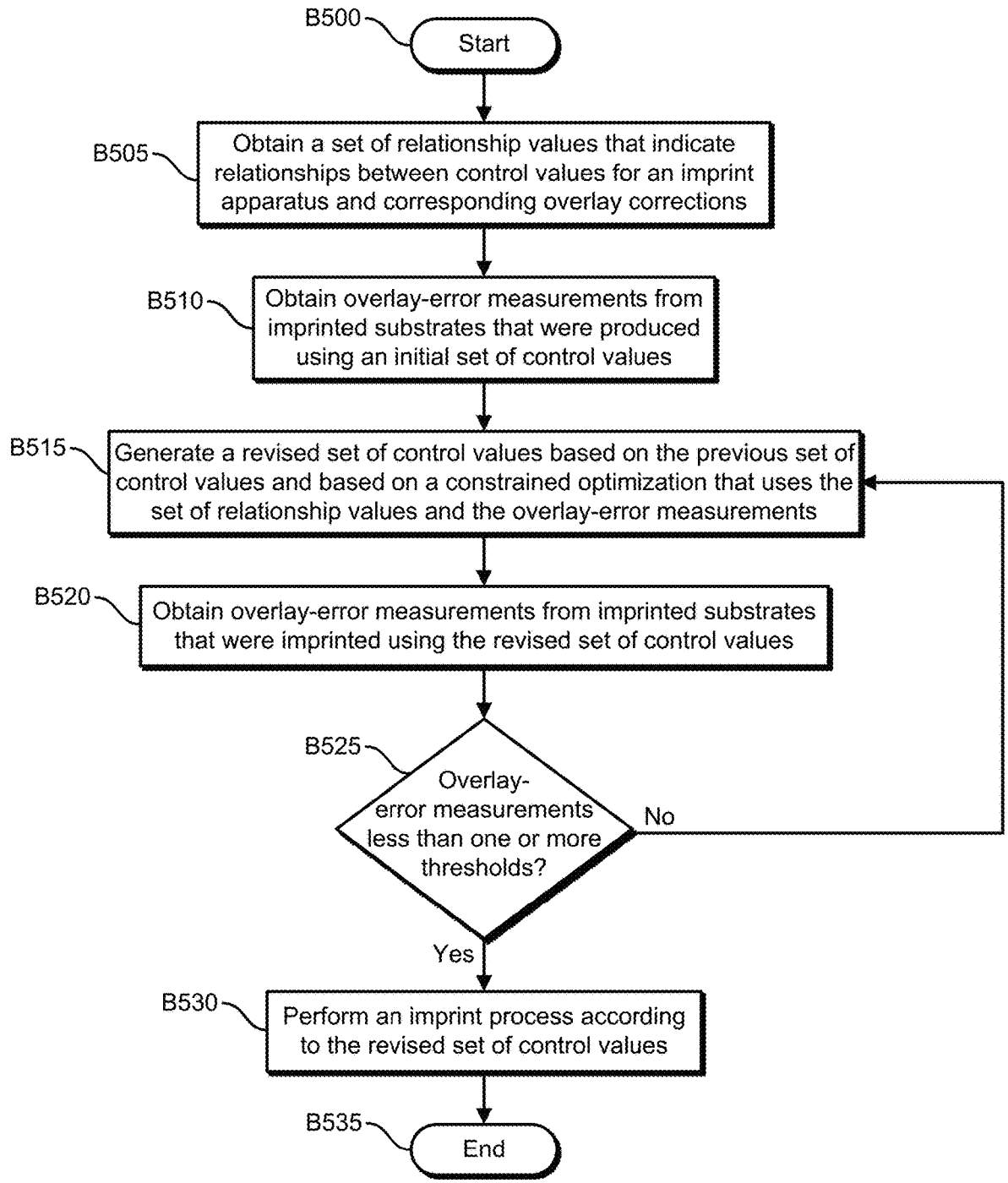
FIG. 5 illustrates an example embodiment of an operational flow for generating control values that correct (e.g., reduce, eliminate) overlay errors.

FIG. 5 illustrates an example embodiment of an operational flow for generating control values that correct (e.g., reduce, eliminate) overlay errors. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by an imprint system 100, some embodiments of these operational flows are performed by one or more imprint devices or by one or more other specially-configured computing devices.

In FIG. 5, the flow starts in block B500 and then moves to block B505, where an imprint system obtains a set of relationship values that indicate relationships between control values for an imprint apparatus and corresponding overlay corrections. Next, in block B510, the imprint system obtains overlay-error measurements (measurements of overlay errors) from imprinted substrates that were produced using an initial set of control values. The overlay-error measurements may measure positions of the imprinted features relative to features on an underlying layer at specific positions (e.g., overlay marks) on imprint field.

The flow then moves to block B515, where the imprint system generates a revised set of control values based on at least the previous set of control values (some embodiments use more than one (e.g., all) of the previous sets of control values) and based on a constrained optimization that uses (i) the set of relationship values and (ii) the overlay-error measurements to generate correction offsets. In some embodiments, the optimization is a least square solver or least square regression, such as a constrained least square optimization. And the imprint system constrains the optimization by constraining (e.g., limiting) the values in the correction offsets such that the imprint system can actually implement the revised set of control values. For example, the imprint system constrains the control value of a deformation mechanism to be a control value in the range of control values that the deformation mechanism in the imprint system can actually implement.

The flow then proceeds to block B520, where the imprint system obtains overlay-error measurements from imprinted substrates that were imprinted using the revised set of control values. In some embodiments, the imprint system imprints the substrates or measures the overlay errors.

The flow then advances to block B525, where the imprint system determines whether the overlay-error measurements are less than one or more thresholds. For example, the overlay-error measurements may include respective overlay-error measurements for multiple locations on a substrate (e.g., locations that have overlay marks), and the overlay-error measurements may include a respective X-axis overlay-error measurement and a respective Y-axis overlay-error measurement for each of the locations. Also the imprint system may determine one or more of the following: whether a mean of the X-axis components of the overlay-error measurements is less than a threshold, whether a mean of the Y-axis components of the overlay-error measurements is less than a threshold, whether one or more standard deviations (e.g., three standard deviations) of the X-axis components of the overlay-error measurements are less than a threshold, whether one or more standard deviations of the Y-axis components of the overlay-error measurements are less than a threshold, whether an absolute value of the mean plus one or more (e.g., three) standard deviations of the X-axis components of the overlay-error measurements are less than a threshold, or whether an absolute value of the mean plus one or more (e.g., three) standard deviations of the Y-axis components of the overlay-error measurements are less than a threshold. Furthermore, the imprint system may determine whether the overlay-error measurements are less than one or more thresholds for different order components of a model that describes the overlay-error measurements, such as first-order components, second-order components, third-order components, etc. In some embodiments, other statistical descriptions of the overlay-error measurements may be used, such as higher-order statistics, combinations of different statistical values, etc.

If the imprint system determines that the overlay-error measurements are not less than one or more thresholds (B525=No), then the flow returns to block B515, where the imprint system generates another revised set of control values based on the previous revised set of control values and based on the overlay-error measurements that were obtained in block B520.

If the imprint system determines that the overlay-error measurements are less than one or more thresholds (B525=Yes), then the flow proceeds to block B530, where the imprint system performs some or all of an imprinting process on a substrate according to the last revised set of control values. During the imprinting process, some of the overlay-error components (for example, $shift_x$, $shift_y$, rotation, magnification, and skew, but which may include other components as well) are also corrected in real-time using feedback sensing and control. And hence, the relevant control values from B525 can be applied as a feedforward setpoint offset to those feedback control loops during the imprinting process of device substrates. Also, in some embodiments, the imprint system stores or outputs the last revised set of control values in addition to, or in alternative to, performing the imprinting process. And the flow ends in block B535.

Figure 6:
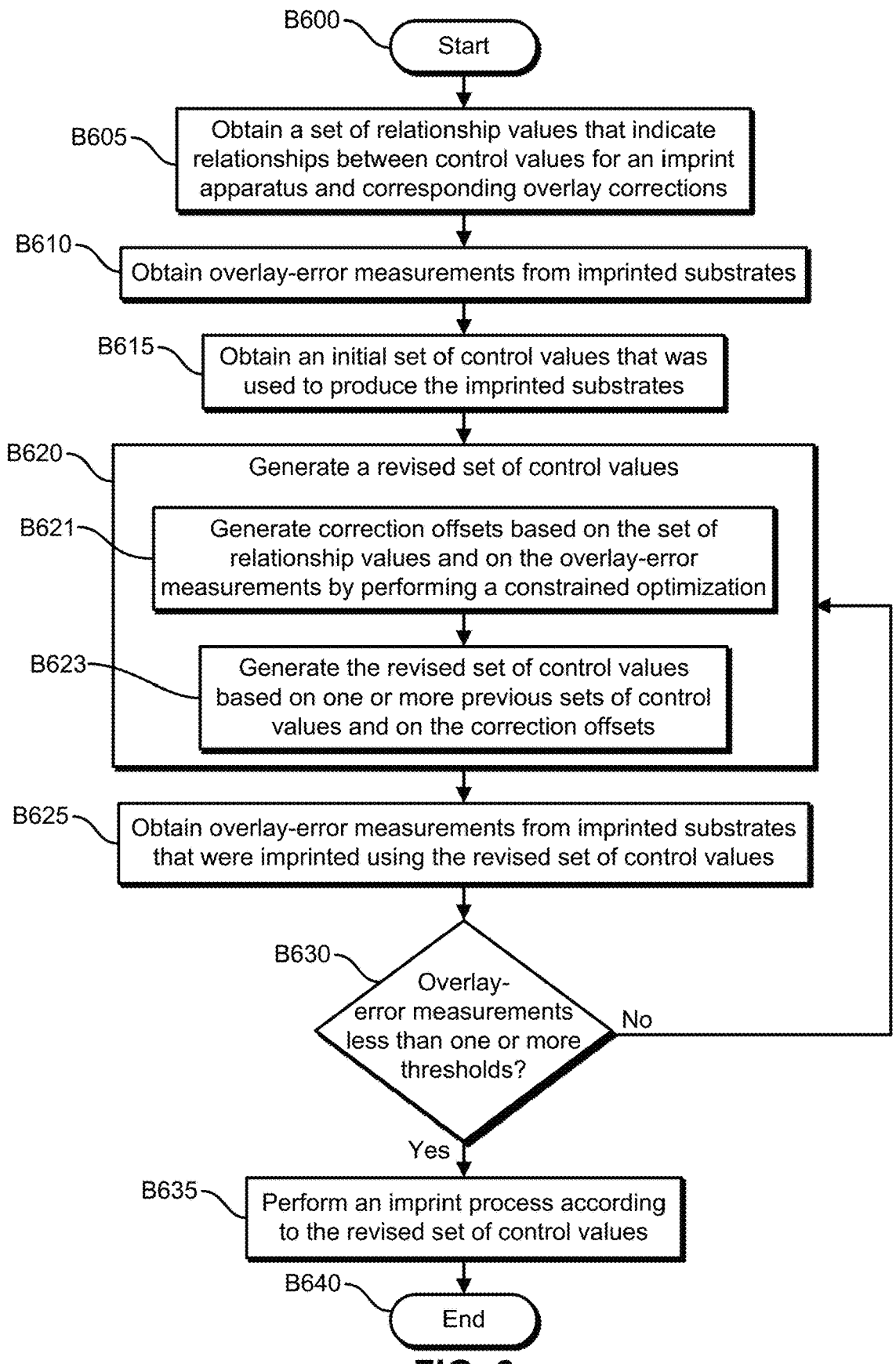
FIG. 6 illustrates an example embodiment of an operational flow for generating control values that correct overlay errors.

FIG. 6 illustrates an example embodiment of an operational flow for generating control values that correct overlay errors. The flow starts in block B600 and then moves to block B605, where an imprint system obtains a set of relationship values that indicate relationships between control values for an imprint apparatus and corresponding overlay corrections. For example, in some embodiments, the relationships can be described by the following:

$$\begin{bmatrix} Ax_{Mag} & Ax_{DMD} & Ax_{Stage} & Ax_{DPC} & Ax_{FIF-Tilt} \\ Ay_{Mag} & Ay_{DMD} & Ay_{Stage} & Ay_{DPC} & Ay_{FIF-Tilt} \end{bmatrix}, \quad (1)$$

where $Ax_{Mag}$ is an array of values that represent the relationships between forces applied by deformation mechanisms to the sides of the template and overlay errors in the X direction, where $Ay_{Mag}$ is an array of values that represent the relationships between forces applied by deformation mechanisms to the sides of the template and overlay errors in the Y direction, where $Ax_{DMD}$ is an array of values that represent the relationship between the amount of energy supplied (for example by mirrors of a DMD) to heat up portions of a substrate in an imprint field and overlay errors in the X direction, where $Ay_{DMD}$ is an array of values that represent the relationship between the amount of energy supplied (for example by mirrors of a DMD) to heat up portions of a substrate in an imprint field and overlay errors in the Y direction, where $Ax_{Stage}$ is an array of values that represent the relationship between an imprint-field position relative to the template and the overlay errors in the X direction, where $Ay_{Stage}$ is an array of values that represent the relationship between an imprint-field position relative to the template and the overlay errors in the Y direction, where $Ax_{DPC}$ is an array of values that represent the relationship between drop-pattern correction and the overlay errors in the X direction, where $Ay_{DPC}$ is an array of values that represent the relationship between drop-pattern correction and the overlay errors in the Y direction, where $Ax_{FIF-Tilt}$ is an array of values that represent the relationship between final imprint force and tilt and their impact on the overlay errors in the X direction, and where $Ay_{FIF-Tilt}$ is an array of values that represent the relationship between final imprint force and tilt and their impact on the overlay errors in the Y direction.

Also, $Ax_{Mag}$ and $Ay_{Mag}$ may be determined experimentally or through finite element methods. $Ax_{DMD}$ and $Ay_{DMD}$ may indicate the overlay effects of energy supplied by pixels of a spatial light modulator (SLM), for example a DMD, at the imprint field and may be determined experimentally or through finite element methods. For example, the DMD may have 1024×768, 1920×1080, or 2560×1600 pixels. Also, the pixels may be grouped together.

Additional details herein will be illustrated by referring to an example embodiment. This example embodiment is provided to help explain various features, not limit every embodiment. Thus, various embodiments differ from this example embodiment.

In this example embodiment, the substrate includes MPI overlay-alignment marks per imprint field (where MPI is a positive integer). For example, in some embodiments MPI is one of the following: 50, 75, 100, 143, 150, 157, 200, 300, 500, 1000, 1500 (although MPI may be different from these examples in some embodiments). Also, the deformation device includes 16 deformation mechanisms but only 13 independent deformation modes (it excludes in-plane translation and rotation), so $Ax_{Mag}$ and $Ay_{Mag}$ can either be MPI×16 or MPI×13 matrices. Furthermore, the pixels of the DMD are grouped into 99 groups of pixels, and $Ax_{DMD}$ and $Ay_{DMD}$ are MPI×99 matrices. $Ax_{Stage}$ and $Ay_{Stage}$ are MPI×3 matrices. And $Ax_{DPC}$ and $Ay_{DPC}$ are MPI×4*m*n matrices, where m and n are the number of basis modes (e.g., Fourier basis modes) that are used to describe the distortions (e.g., out-of-plane distortions). For example, a discrete two-dimensional Fourier transform may be performed on a desired DPC out-of-plane distortions, and a limited number (m and n) of the Fourier basis modes may then be used to describe the distortion.

Next, in block B610, the imprint system obtains overlay-error measurements from imprinted substrates. In some embodiments, the overlay-error measurements can be described by the following:

$$\begin{bmatrix} e_x \\ e_y \end{bmatrix}, \quad (2)$$

where $e_x$ is a vector of overlay-error measurements at the overlay-alignment marks in the X direction for a particular imprint field and where $e_y$ is a vector of overlay-error measurements at the overlay-alignment marks in the Y direction for a particular imprint field. In the example embodiment, which includes MPI overlay-alignment marks per imprint field, $e_x$ and $e_y$ may both be MPI×1 vectors. Also, the overlay-error measurements may be averages of the overlay-error measurements in the particular imprint field across the imprinted substrates.

Then, in block B615, the imprint system obtains an initial set of control values that was used to produce the imprinted substrates. In some embodiments, a set of control values can be described by the following:

$$\begin{bmatrix} F_{Mag} \\ F_{DMD} \\ F_{Stage} \\ F_{DPC} \\ F_{FIF-Tilt} \end{bmatrix}, \quad (3)$$

where $F_{Mag}$ is an array (e.g., a 16×1 or 13×1 array in the example embodiment) of values that represent the deformation-mechanism control values; where $F_{DMD}$ is an array (e.g., a 99×1 array in the example embodiment) of values that represent the amount of energy that supplied by the DMD to heat the substrates; where $F_{stage}$ is an array (e.g., a 3×1 array in the example embodiment) of values that represent the amount of stage shift in the X direction, the amount of stage shift in the Y direction, and the rotation of the stage about the Z axis (theta); where $F_{DPC}$ are coefficients of the different constituent basis functions (for example Fourier basis modes in a Fourier series); and where $F_{FIF-Tilt}$ is an array (e.g., a 3×1 array in the example embodiment) of values that represent the final imprint force and tilt. And these control values indicate the control values that the imprint system uses when applying the modes of correction, which include heating, deformation, force, tilt, translation, rotation, and drop-pattern compensation.

The flow then moves to block B620, where the imprint system generates a revised set of control values based on at least the previous set of control values (some embodiments use more than one (e.g., all) of the previous sets of control values) and based on a constrained optimization that uses (i) the set of relationship values and (ii) the overlay-error measurements. This embodiment of block B620 includes blocks B621 and B623

In block B621, the imprint system generates correction offsets based on the set of relationship values and on the overlay-error measurements by performing a constrained optimization. For example, in some embodiments the constrained optimization can be described by $$\begin{bmatrix} e_x \\ e_y \end{bmatrix} = \begin{bmatrix} Ax_{Mag} & Ax_{DMD} & Ax_{Stage} & Ax_{DPC} & Ax_{FIF-Tilt} \\ Ay_{Mag} & Ay_{DMD} & Ay_{Stage} & Ay_{DPC} & Ay_{FIF-Tilt} \end{bmatrix} \begin{bmatrix} F_{Mag_{calc}} \\ F_{DMD_{calc}} \\ F_{Stage_{calc}} \\ F_{DPC_{calc}} \\ F_{FIF-Tilt_{calc}} \end{bmatrix} + \begin{bmatrix} \varepsilon_x \\ \varepsilon_y \end{bmatrix}, \quad (4)$$

where $$\begin{bmatrix} F_{Mag_{calc}} \\ F_{DMD_{calc}} \\ F_{Stage_{calc}} \\ F_{DPC_{calc}} \\ F_{FIF-Tilt_{calc}} \end{bmatrix}$$

is the correction offsets, where $\varepsilon_x$ is a vector of values that represent the overlay-error measurements in the X direction that are not described by the relationship values and control values, and where $\varepsilon_y$ is a vector of values that represent the overlay-error measurements in the Y direction that are not described by the relationship values and control values.

By performing a combined simultaneous optimization that uses multiple (e.g., all in the embodiment in FIG. 6) of the relationship values and control values, the system and method can account for (and take advantage of) the collinearities between the modes of correction or the collinearities between the different overlay-error components. Many of the above modes of overlay corrections are not orthogonal to each other (i.e., the corrections induced by one mode of correction can also be partially induced by another mode of correction). For example, the columns of the matrix in equation (1) can have collinearities. When performing a combined constrained least squares regression with a non-orthogonal design matrix (e.g., the matrix in equation (1)), the overlay-error variance may be distributed or assigned among multiple collinear modes to minimize the residuals. In contrast, when performing sequential individual regressions for the different modes of overlay corrections, each individual least squares regression cannot distribute or assign the overlay-error variance to other collinear modes (that are not included in the regression), and thus the final residual error variance after all the modes have been individually optimized is larger when compared to the residual error variance when running a simultaneous regression. If all the modes of overlay corrections produced orthogonal effects (if the columns of the matrix in equation (1) were orthogonal), in that case running sequential regressions would produce the same residual variance as the simultaneous regression.

In block B623, the imprint system generates the revised set of control values based on one or more previous sets of control values and on the correction offsets. For example, in some embodiments, the revised set of control values produced by the i-th iteration of block B620 can be described by the following (where 0 is the iteration of the initial set of control values):

$$F_i = \begin{bmatrix} F_{Mag_i} \\ F_{DMD_i} \\ F_{Stage_i} \\ F_{DPC_i} \\ F_{FIF-Tilt_i} \end{bmatrix} = \begin{bmatrix} F_{Mag_{i-1}} \\ F_{DMD_{i-1}} \\ F_{Stage_{i-1}} \\ F_{DPC_{i-1}} \\ F_{FIF-Tilt_{i-1}} \end{bmatrix} + G * F_{calc}, \quad (5)$$

where $$F_{calc} = \begin{bmatrix} F_{Mag_{calc}} \\ F_{DMD_{calc}} \\ F_{Stage_{calc}} \\ F_{DPC_{calc}} \\ F_{FIF-Tilt_{calc}} \end{bmatrix}, \quad (6)$$

and where G is a gain matrix. The gain matrix G can be applied to the calculated values to account for any inefficiencies in accurately modeling the relationships between the control values and the overlay corrections. The gain matrix G could include the gains for the individual correction modes (deformation, heat, stage position, DPC, force-tilt, etc.).

Thus, in some embodiments, the revised set of control values produced by block B620 is an aggregate (e.g., sum) of the initial control values and all of the correction offsets.

Additionally, the constraint limits for the constrained optimization for the current iteration of block B621 can be computed based on the limits of the control values and, after the first iteration, on the control values that were output by the previous iteration of block B623. For every iteration of block B623, $$F_{min} \leq F_i \leq F_{max},$$

where $F_{min}$ is a matrix of the lower limits of the control values, where $F_i$ is the matrix of the control values output by the i-th iteration of block B623, and where $F_{max}$ is a matrix of the upper limits of the control values. Accordingly, for every iteration of block B621 after the first iteration, $$\frac{(F_{min} - F_{i-1})}{G} \leq F_{calc} \leq \frac{(F_{max} - F_{i-1})}{G},$$

where $F_{i-1}$ is the control values that were output by the previous iteration of block B623, and where $F_{calc}$ is the correction offsets of the current iteration (the i-th iteration) of block B621. Thus, the lower constraint limits for the i-th iteration of block B621 can be described by $$\frac{(F_{min} - F_{i-1})}{G},$$

and the upper constraint limits for the i-th iteration of block B621 can be described by $$\frac{(F_{max} - F_{i-1})}{G}.$$

For example, if $F_{min}=0$ N and $F_{max}=65$ N for a deformation-mechanism control value, if $F_3=23$ N from the previous iteration of block B623, and if the gain G=1, then the constraint limits for the deformation-mechanism control value for the next iteration (iteration $F_4$) of block B621 would be $F_{min}-23=-23$ N and $F_{max}-23=32$ N.

The flow then proceeds to block B625, where the imprint system obtains overlay-error measurements from imprinted substrates that were imprinted using the revised set of control values. In some embodiments, the imprint system imprints the substrates and may measure the overlay errors.

The flow then advances to block B630, where the imprint system determines whether the overlay-error measurements are less than one or more thresholds. For example, some embodiments of the imprint system determine whether a mean of the X-axis components of the overlay-error measurements is less than a threshold, whether a mean of the Y-axis components of the overlay-error measurements is less than a threshold, whether one or more standard deviations (e.g., three standard deviations) of the X-axis components of the overlay-error measurements are less than a threshold, whether one or more standard deviations (e.g., three standard deviations) of the Y-axis components of the overlay-error measurements are less than a threshold, whether an absolute value of the mean plus one or more (e.g., three) standard deviations of the X-axis components of the overlay-error measurements are less than a threshold, or whether an absolute value of the mean plus one or more (e.g., three) standard deviations of the Y-axis components of the overlay-error measurements are less than a threshold. Furthermore, the imprint system may determine whether the overlay-error measurements are less than one or more thresholds for different order components of a model that describes the overlay-error measurements, such as first-order components, second-order components, third-order components, etc.

If the imprint system determines that the overlay-error measurements are not less than one or more thresholds (B630=No), then the flow returns to block B620, where the imprint system generates another revised set of control values based on the previous revised set of control values and based on the overlay-error measurements that were obtained in block B625.

If the imprint system determines that the overlay-error measurements are less than one or more thresholds (B630=Yes), then the flow proceeds to block B635, where the imprint system performs some or all of an imprinting process on a substrate according to the last revised set of control values. During the imprinting process, some of the overlay-error components (for example, shift$_x$ (the shift in the X direction), shift$_y$ (the shift in the Y direction), rotation, magnification, and skew, but can include other components as well) are also corrected in real-time using feedback sensing of TTM alignment marks and control. And hence, the relevant control values from B625 can be applied as a feedforward setpoint offset to those feedback control loops during the imprinting process of device substrates. Also, in some embodiments, the imprint system stores or outputs the last revised set of control values in addition to, or in alternative to, performing the imprinting process. And the flow ends in block B640.

Figure 7:
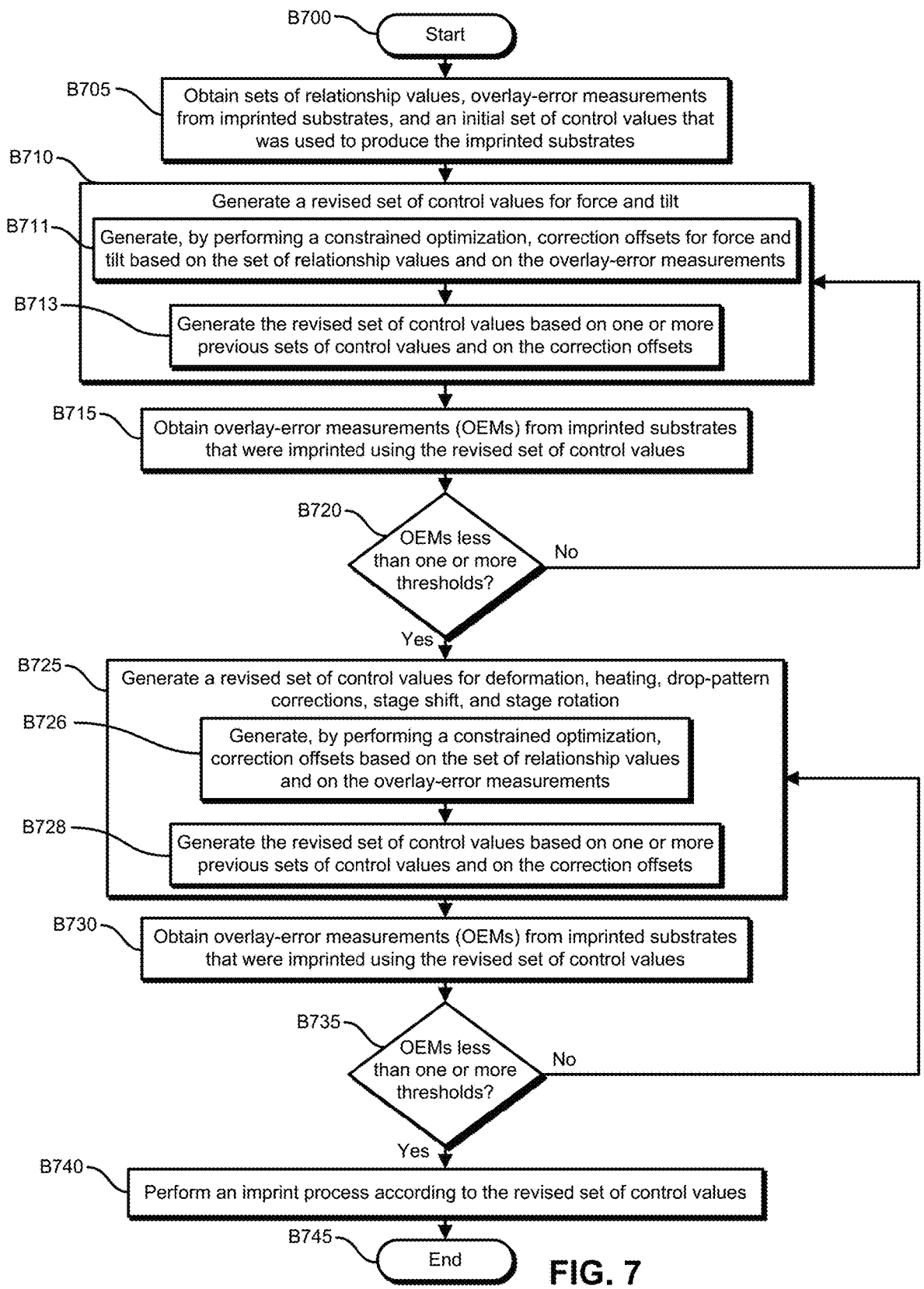
FIG. 7 illustrates an example embodiment of an operational flow for generating control values that correct overlay errors.

FIG. 7 illustrates an example embodiment of an operational flow for generating control values that correct overlay errors. The flow starts in block B700 and then moves to block B705, where an imprint system obtains a set of relationship values that indicate relationships between control values for an imprint apparatus and corresponding overlay corrections, overlay-error measurements from imprinted substrates, and an initial set of control values that was used to produce the imprinted substrates.

Then, in block B710, the imprint system generates a revised set of control values for force and tilt. And this embodiment of block B710 includes blocks B711 and B713. In block B711, the imprint system generates, by using a constrained optimization, correction offsets for force and tilt control values based on the set of relationship values for force and tilt and on the overlay-error measurements.

For example, in some embodiments the constrained optimization can be described by $$\begin{bmatrix} e_x \\ e_y \end{bmatrix} = \begin{bmatrix} 1 & 0 & X & 0 & Y & 0 & XY & 0 & f_x & t_{xx} & t_{yx} \\ 0 & 1 & 0 & Y & 0 & X & 0 & XY & f_y & t_{xy} & t_{yy} \end{bmatrix} [k] + \begin{bmatrix} \varepsilon_x \\ \varepsilon_y \end{bmatrix}, \quad (7)$$

where $$\begin{bmatrix} e_x \\ e_y \end{bmatrix}$$

are the overlay-error measurements; where X and Y are the X-coordinates and Y-coordinates of overlay-measurement marks (e.g., overlay-measurement marks in an imprint field in which overlay-error measurements are acquired), and the coefficients of the terms X and Y in a polynomial fitting describe the relationships between the overlay-error measurements and overall overlay characterizations of Magnification$_x$, Magnification$_y$, Skew$_x$, and Skew$_y$ (which are described below); where XY is the product of the X-coordinates and Y-coordinates of the overlay-measurement marks, and the coefficients of the terms XY in a polynomial fitting describe the relationships between the overlay-error measurements and overall overlay characterizations of Trapezoidal$_x$ and Trapezoidal$_y$ (which are described below); where $f_x$ is a vector of values (which may be determined by finite element methods or by experimentation) that describe the relationship between the imprint force and overlay errors in the X direction; where $f_y$ is a vector of values (which may be determined by finite element methods or by experimentation) that describe the relationship between the imprint force and overlay errors in the Y direction; where $t_{xx}$ is a vector of values (which may be determined by finite element methods or by experimentation) that describe the relationship between (i) overlay errors in the X direction and (ii) the tilt of the template around the X axis relative to the wafer surface or relative to a specific plane; where $t_{xy}$ is a vector of values (which may be determined by finite element methods or by experimentation) that describe the relationship between (i) overlay errors in the Y direction and (ii) the tilt of the template around the X axis relative to the wafer surface or relative to a specific plane; where $t_{yx}$ is a vector of values (which may be determined by finite element methods or by experimentation) that describe the relationship between (i) overlay errors in the X direction and (ii) the tilt of the template around the Y axis relative to the wafer surface or relative to a specific plane; where $t_{yy}$ is a vector of values (which may be determined by finite element methods or by experimentation) that describe the relationship between (i) overlay errors in the Y direction and (ii) the tilt of the template around the Y axis relative to the wafer surface or relative to a specific plane; where $\varepsilon_x$ is a vector of values that represent the overlay-error measurements in the X direction that are not described by the relationship values and control values described in equation (7); where $\varepsilon_y$ is a vector of values that represent the overlay-error measurements in the Y direction that are not described by the relationship values and control values; and where $$[k] = \begin{bmatrix} \text{Shift}_x \\ \text{Shift}_y \\ \text{Magnification}_x \\ \text{Magnification}_y \\ \text{Skew}_x \\ \text{Skew}_y \\ \text{Trapezoidal}_x \\ \text{Trapezoidal}_y \\ \text{Force}_{calc} \\ \text{Tilt}_{x_{calc}} \\ \text{Tilt}_{y_{calc}} \end{bmatrix}. \quad (8)$$

Also, in equation (8), $\text{Shift}_x$ is a value that indicates (e.g., estimates) the shift in the X direction of the template relative to the imprint field on the substrate; $\text{Shift}_y$ is a value that indicates (e.g., estimates) the shift in the Y direction of the template relative to the imprint field on the substrate; $\text{Magnification}_x$ is a value that indicates a size of the template in the X direction relative to the size of the imprint field on the substrate in the X direction; $\text{Magnification}_y$ is a value that indicates a size of the template in the Y direction relative to the size of the imprint field on the substrate in the Y direction; $\text{Skew}_x$ is a value that indicates skewing of the template in the X direction relative to the imprint field on the substrate, such that sides of the template are not orthogonal relative to the imprint field; $\text{Skew}_y$ is a value that indicates skewing of the template in the Y direction relative to the imprint field on the substrate, such that sides of the template are not orthogonal relative to the imprint field; $\text{Trapezoidal}_x$ is a value that indicates trapezoidal characteristics of the overlay-error measurements in the X direction where a square or rectangle assumes the shape of a trapezium, with trapezium including a trapezoid; $\text{Trapezoidal}_y$ is a value that indicates trapezoidal characteristics of the overlay-error measurements in the Y direction where a square or rectangle assumes the shape of a trapezium, with trapezium including a trapezoid; Force ($\text{Force}_{calc}$) is the imprint force; $\text{Tilt}_x$ ($\text{Tilt}_{x_{calc}}$) is a value that indicates the tilt of the template around the X axis relative to the imprint field; and $\text{Tilt}_y$ ($\text{Tilt}_{y_{calc}}$) is a value that indicates the tilt of the template around the Y axis relative to the imprint field.

Also, in the example embodiment in which the substrate includes MPI overlay-alignment marks per imprint field, X, Y, and XY are each a respective MPI×1 vector. Also, $\text{Magnification}_x$, $\text{Magnification}_y$, $\text{Skew}_x$, $\text{Skew}_y$, $\text{Trapezoidal}_x$, $\text{Trapezoidal}_y$, $f_x$, $f_y$, $t_{xx}$, $t_{xy}$, $t_{yx}$, and $t_{yy}$ are each a respective MPI×1 vector.

In block B711, the generated correction offsets for force and tilt are described by $\text{Force}_{calc}$, $\text{Tilt}_{x_{calc}}$, and $\text{Tilt}_{y_{calc}}$.

In block B713, the imprint station generates the revised set of control values based on one or more previous sets of control values and on the correction offsets. For example, to generate the revised set of control values, the imprint station may adjust the control values for force and tilt in the previous set of control values according to the correction offsets for force and tilt (e.g., by adding the correction offsets for force and tilt to the control values for force and tilt in the previous set of control values).

After block B710, the flow moves to block B715, where the imprint system obtains overlay-error measurements (OEMs) from imprinted substrates that were imprinted using the revised set of control values. In some embodiments, the imprint system imprints the substrates or measures the overlay errors. The flow then advances to block B720, where the imprint system determines whether the overlay-error measurements are less than one or more thresholds. If the imprint system determines that the overlay-error measurements are not less than one or more thresholds (B720=No), then the flow returns to block B710, where the imprint system generates another revised set of control values based on the previous revised set of control values and based on the overlay-error measurements that were obtained in block B715. If the imprint system determines that the overlay-error measurements are less than one or more thresholds (B720=Yes), then the flow proceeds to block B725.

In block B725, the imprint station generates a revised set of control values for deformation (for one or more deformation mechanisms), for heating (for a substrate-heating subsystem), for drop-pattern corrections, for stage shift, and for stage rotation. This embodiment of block B725 includes blocks B726 and B728.

In block B726, the imprint system generates, by performing a constrained optimization, correction offsets based on the applicable set of relationship values and on the overlay-error measurements. For example, some embodiments of the constrained optimization can be described by $$\begin{bmatrix} T_x \\ T_y \end{bmatrix} = \begin{bmatrix} Ax_{Mag} & Ax_{DMD} & Ax_{Stage} & Ax_{DPC} \\ Ay_{Mag} & Ay_{DMD} & Ay_{Stage} & Ay_{DPC} \end{bmatrix} \begin{bmatrix} F_{Mag_{calc}} \\ F_{DMD_{calc}} \\ F_{Stage_{calc}} \\ F_{DPC_{calc}} \end{bmatrix} + \begin{bmatrix} \varepsilon_x \\ \varepsilon_y \end{bmatrix}, \quad (9)$$

where $T_x = e_x - f_x * \text{Force} - t_{xx} * \text{Tilt}_x - t_{yx} * \text{Tilt}_y$, where $T_y = e_y - f_y * \text{Force} - t_{yy} * \text{Tilt}_y - t_{xy} * \text{Tilt}_x$, where $\varepsilon_x$ is a vector of values that represent the overlay-error measurements in the X direction that are not described by the relationship values and control values, and where $\varepsilon_y$ is a vector of values that represent the overlay-error measurements in the Y direction that are not described by the relationship values and control values.

And, in the example embodiment in which the substrate includes MPI overlay-alignment marks per imprint field, $T_x$ and $T_y$ are each a respective MPI×1 vector.

By performing a combined simultaneous optimization that uses multiple relationship values and control values, the system and method can account for (and take advantage of) collinearities between the modes of overlay corrections or collinearities between the different overlay-error components in order to reduce overlay residual errors.

In block B728, the imprint station generates the revised set of control values based on one or more previous sets of control values and on the correction offsets that were generated in block B726. For example, to generate the revised set of control values, the imprint station may adjust the control values for deformation, for heating, for drop-pattern corrections, for stage shift, and for stage rotation in the previous set of control values according to the correction offsets that were generated in block B726 (e.g., by adding the correction offsets for deformation, for heating, for drop-pattern corrections, for stage shift, and for stage rotation to the control values for deformation, for heating, for drop-pattern corrections, for stage shift, and for stage rotation in the previous set of control values).

After block B725, the flow moves to block B730, where the imprint system obtains overlay-error measurements (OEMs) from imprinted substrates that were imprinted using the revised set of control values. In some embodiments, the imprint system imprints the substrates or measures the overlay errors. The flow then advances to block B735, where the imprint system determines whether the overlay-error measurements are less than one or more thresholds. If the imprint system determines that the overlay-error measurements are not less than one or more thresholds (B735=No), then the flow returns to block B725, where the imprint system generates another revised set of control values based on the previous revised set of control values and based on the overlay-error measurements that were obtained in block B730. If the imprint system determines that the overlay-error measurements are less than one or more thresholds (B735=Yes), then the flow proceeds to block B740.

In block B740, the imprint system performs some or all of an imprinting process on a substrate according to the last revised set of control values. During the imprinting process, some of the overlay-error components (for example, shift$_x$, shift$_y$, rotation, magnification, and skew, but can include other components as well) are also corrected in real-time using feedback sensing and control. And hence, the relevant control values from B725 can be applied as a feedforward setpoint offset to those feedback control loops during the imprinting process of device substrates. Also, in some embodiments, the imprint system stores or outputs the last revised set of control values in addition to, or in alternative to, performing the imprinting process. And the flow ends in block B745.

Also, although the operational flow in FIG. 7 performs combined simultaneous optimizations of force and tilt and performs combined simultaneous optimizations of deformation, heating, drop-pattern corrections, stage shift, and stage rotation, some embodiments perform combined simultaneous optimizations of different combinations of the modes of overlay corrections. Depending on the embodiment, any applicable subset of the columns of equation (1) can be used in a combined simultaneous optimization. For example, some embodiments calculate $$\begin{bmatrix} Ax_{Mag} & Ax_{DMD} & Ax_{Stage} & Ax_{FIF-Tilt} \\ Ay_{Mag} & Ay_{DMD} & Ay_{Stage} & Ay_{FIF-Tilt} \end{bmatrix} \quad (10)$$

in a combined simultaneous optimization and then calculate $Ax_{DPC}$ and $Ay_{DPC}$. Also for example, some embodiments calculate $Ax_{FIF-Tilt}$ and $Ay_{FIF-Tilt}$, then calculate $$\begin{bmatrix} Ax_{Mag} & Ax_{DMD} & Ax_{Stage} \\ Ay_{Mag} & Ay_{DMD} & Ay_{Stage} \end{bmatrix} \quad (11)$$

in a combined simultaneous optimization, and then calculate $Ax_{DPC}$ and $Ay_{DPC}$.

Figure 8:
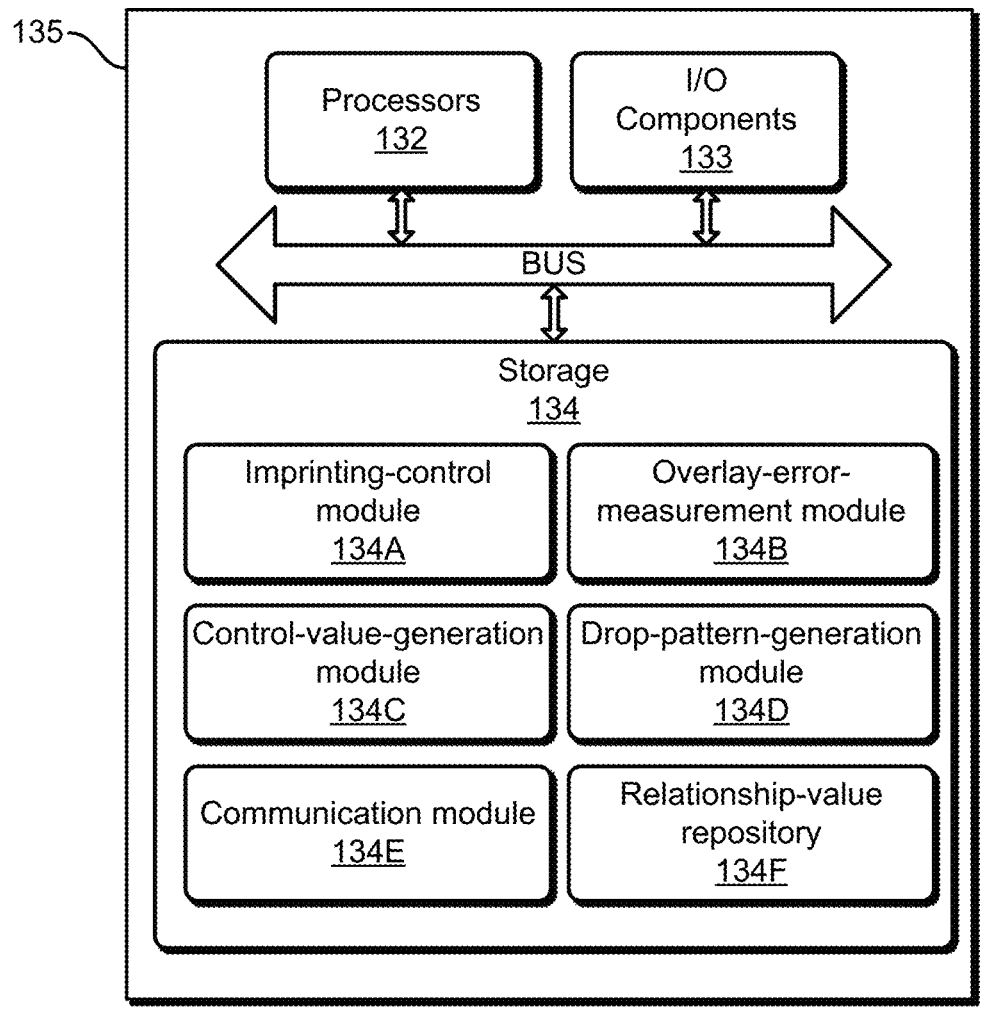
FIG. 8 illustrates an example embodiment of a lithography-control device.

FIG. 8 illustrates an example embodiment of a lithography-control device. The lithography-control device 135 includes one or more processors 132, one or more I/O components 133, and storage 134. Also, the hardware components of the lithography-control device 135 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 132 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 133 may include communication components that communicate with one or more of the following: a substrate positioning stage, an imprint head, a fluid dispenser, an energy source, and a camera. Also, the I/O components 133 may include communication components (e.g., a graphics card, a network-interface controller) that communicate with a network, a nanoimprint-lithography-control device, or with input or output devices (not illustrated), for example a display device, a keyboard, a mouse, a printing device, a touch screen, a light pen, an optical-storage device, a scanner, a microphone, a drive, a joystick, and a control pad.

The storage 134 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 134, which may include both ROM and RAM, can store computer-readable data or computer-executable instructions.

The lithography-control device 135 also includes an imprinting-control module 134A, an overlay-error-measurement module 134B, a control-value-generation module 134C, a drop-pattern-generation module 134D, and a communication module 134E. A module includes logic, computer-readable data, or computer-executable instructions. In the embodiment shown in FIG. 8, the modules are implemented in software (e.g., Assembly, C, C++, C #, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 134. Also, some embodiments of the lithography-control device 135 include additional modules, omit some of these modules, combine these modules into fewer modules, or divide these modules into more modules. Additionally, the lithography-control device 135 includes a relationship-value repository 134F, which stores one or more sets of relationship values.

The imprinting-control module 134A includes instructions that cause the applicable components (e.g., the processors 132, the I/O components 133, the storage 134) of the lithography-control device 135 to control various functions and components (e.g., a substrate positioning stage, an imprint head, a fluid dispenser, an energy source, an imaging device, a deformation device, a substrate-heating system) of an imprint system (or imprint device) to perform imprinting processes on the imprint fields of substrates. For example, some embodiments of the imprinting-control module 134A include instructions that cause the applicable components of the lithography-control device 135 to control an imprint system to perform at least some of the operations that are described in block B530 in FIG. 5, in block B635 in FIG. 6, and in block B740 in FIG. 7. Also, the applicable components of the lithography-control device 135 operating according to the imprinting-control module 134A realize an example of an imprinting-control unit.

The overlay-error-measurement module 134B includes instructions that cause the applicable components (e.g., the processors 132, the I/O components 133, the storage 134) of the lithography-control device 135 to obtain overlay-error measurements, for example by measuring overlay errors on imprinted substrates or by acquiring overlay-error measurements from another device. For example, some embodiments of the overlay-error-measurement module 134B include instructions that cause the applicable components of the lithography-control device 135 to perform at least some of the operations that are described in blocks B510 and B520 in FIG. 5; in blocks B610 and B625 in FIG. 6; and in blocks B705, B715, and B730 in FIG. 7. Also, the applicable components of the lithography-control device 135 operating according to the overlay-error-measurement module 134B realize an example of an error-measurement unit.

The control-value-generation module 134C includes instructions that cause the applicable components (e.g., the processors 132, the I/O components 133, the storage 134) of the lithography-control device 135 to generate control values for an imprint system or imprint device. For example, some embodiments of the control-value-generation module 134C include instructions that cause the applicable components of the lithography-control device 135 to perform at least some of the operations that are described in blocks B505, B515, and B525 in FIG. 5; in blocks B605, B615, B620, and B630 in FIG. 6; and in blocks B705, B710, B720, B725, and B735 in FIG. 7. Also, the applicable components of the lithography-control device 135 operating according to the control-value-generation module 134C realize an example of a control-value-generation unit.

The drop-pattern-generation module 134D includes instructions that cause the applicable components (e.g., the processors 132, the I/O components 133, the storage 134) of the lithography-control device 135 to generate one or more drop patterns. Also, the applicable components of the lithography-control device 135 operating according to the drop-pattern-generation module 134D realize an example of a drop-pattern-generation unit.

The communication module 134E includes instructions that cause the applicable components (e.g., the processors 132, the I/O components 133, the storage 134) of the lithography-control device 135 to communicate with one or more other devices (e.g., a display device, another computing device). Also, the applicable components of the lithography-control device 135 operating according to the communication module 134E realize an example of a communication unit.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. Thus, any incorporation by reference of documents above is limited such that no subject matter is incorporated that is contrary to the explicit disclosure herein, and any incorporation by reference of documents above is limited such that any definitions provided in the documents are not incorporated by reference herein unless expressly included herein. In the event of inconsistent usages between this document and those documents so incorporated by reference, the usage in the incorporated reference(s) should be considered supplementary to that of this document; for irreconcilable inconsistencies, the usage in this document controls. Also, any incorporation by reference of documents above is further limited such that no claims included in the documents are incorporated by reference herein.

The invention claimed is:

1. A method of generating a set of control values for an imprint apparatus, the method comprising:
   obtaining a set of relationship values, wherein the set of the relationship values indicates relationships between control values for an imprint apparatus and corresponding overlay corrections; and
   estimating a set of the control values based on a constrained optimization that uses the set of the relationship values and a set of operating constraints, wherein the set of the control values is estimated such that the set of the control values minimizes a residual overlay error and the set of the control values is maintained within the set of the operating constraints,
   wherein the set of the control values includes a set of in-plane control values that are in a plane and a set of out-of-plane control values that are out of the plane, wherein the plane is parallel to a template-substrate interface, and
   wherein the set of the out-of-plane control values includes
      an imprint-force-control value that controls a total force that a template applies to formable material between the template and a substrate or
      a set of tilt-control values that control a tilt of the template relative to the substrate.

2. The method of claim 1, wherein the set of out-of-plane control values includes:
   the imprint-force-control value, and
   the set of the tilt-control values.

3. The method of claim 2, wherein the set of out-of-plane control values further includes a set of drop-pattern control values that represent an amount of extra formable material supplied to different locations on the substrate for locally distorting the template.

4. The method of claim 1, wherein the set of the in-plane control values includes at least one of:
   a set of actuator-control values that control a plurality of actuators configured to compress the template;
   a set of heater-control values that control a heat source configured to heat the substrate; and
   a set of stage-control values that control a substrate stage configured to move the substrate relative to the template and the heat source.

5. The method of claim 1, wherein the residual overlay error is a predicted mismatch between a target distortion of an imprinted field that compensates for a set of overlay errors and a predicted distortion of the imprinted field as produced by the set of the control values.

6. The method of claim 1, wherein, for each control value in the set of the control values, the set of the relationship values indicates respective relationships between the control value and the overlay corrections at measurement positions on the substrate.

7. The method of claim 6, wherein the set of the control values includes at least one respective control value for each actuator of a plurality of actuators configured to compress the template, includes at least one control value for a heat source configured to heat the substrate, and includes at least one control value for a substrate stage configured to move the substrate relative to the template and the heat source.

8. The method of claim 7, wherein the at least one control value for the heat source configured to heat the substrate includes at least one respective control value for each location of a plurality of locations on the substrate.

9. A system comprising:
one or more computer-readable media; and
one or more processors that cooperate with the one or more computer-readable media to:
obtain a set of relationship values, wherein the set of the relationship values indicates relationships between control values for an imprint apparatus and corresponding overlay corrections; and
calculate a set of the control values based on a constrained optimization that uses the set of the relationship values and a set of operating constraints, wherein the set of the control values is calculated such that the set of the control values minimizes a residual overlay error and the set of the control values is maintained within the set of the operating constraints,
wherein the set of the control values includes a set of in-plane control values that are in a plane and a set of out-of-plane control values that are out of the plane, wherein the plane is parallel to a template-substrate interface, and
wherein the set of the out-of-plane control values includes
an imprint-force-control value that controls a total force that a template applies to formable material between the template and a substrate or
a set of tilt-control values that control a tilt of the template relative to the substrate.

10. The system of claim 9, wherein the set of the in-plane control values includes:
a set of actuator control values that control a plurality of actuators configured to compress the template; and
a set of heater control values that control a heat source configured to heat the substrate.

11. The system of claim 10, wherein the set of the out-of-plane control values includes: the imprint-force-control value and the set of the tilt-control values.

12. The system of claim 9, wherein the set of the in-plane control values includes:
a set of stage-control values that control a substrate stage configured to move the substrate relative to the template and a heat source.

13. The system of claim 9, further comprising:
one or more motors that are configured to bring the template into contact with the substrate.

14. The system of claim 9, further comprising:
a plurality of actuators configured to compress the template; and
a heat source configured to heat the substrate.

15. The system of claim 9, wherein the set of the out-of-plane control values further includes:
a set of drop-pattern control values that represent an amount of extra formable material supplied to different locations on the substrate for locally distorting the template.

16. A method comprising:
obtaining a set of relationship values, wherein the set of the relationship values indicates relationships between control values for an imprint apparatus and overlay corrections on a substrate imprinted by a template that is held by the imprint apparatus; and
calculating a set of the control values such that the set of the control values remains within a set of operating constraints and such that a residual overlay error is minimized, wherein calculating the set of the control values includes performing a constrained optimization based on the set of the relationship values and based on the set of the operating constraints,
wherein the set of the control values includes a set of actuator control values that control a plurality of actuators configured to compress the template and a set of heater control values that control a heat source configured to heat the substrate, and
wherein the set of the control values further includes a set of stage-control values that control a substrate stage configured to move the substrate relative to the template and the heat source or a set of drop-pattern-control values that control a fluid dispenser that is configured to deposit drops of formable material on the substrate such that the drops of formable material correct uneven areas on the surface of the substrate.

17. The method of claim 16, wherein the set of the relationship values and the set of the control values are formatted as matrices.

* * * * *